United States Patent
Shim et al.

(10) Patent No.: US 10,840,594 B2
(45) Date of Patent: Nov. 17, 2020

(54) BEAM STEERING DEVICE AND OPTICAL APPARATUS INCLUDING THE SAME

(71) Applicant: SAMSUNG ELECTRONICS CO., LTD., Suwon-si (KR)

(72) Inventors: Dongsik Shim, Hwaseong-si (KR); Byunggil Jeong, Anyang-si (KR); Junghyun Park, Seoul (KR); Byounglyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 394 days.

(21) Appl. No.: 15/870,548

(22) Filed: Jan. 12, 2018

(65) Prior Publication Data
US 2018/0366824 A1    Dec. 20, 2018

(30) Foreign Application Priority Data

Jun. 20, 2017  (KR) .................... 10-2017-0078042

(51) Int. Cl.
| | |
|---|---|
| *H01Q 3/26* | (2006.01) |
| *H01Q 3/08* | (2006.01) |
| *H01Q 3/44* | (2006.01) |
| *H01L 33/44* | (2010.01) |
| *G02F 1/01* | (2006.01) |

(Continued)

(52) U.S. Cl.
CPC ............. *H01Q 3/26* (2013.01); *G01S 7/4817* (2013.01); *G02B 1/002* (2013.01); *G02B 5/008* (2013.01); *G02F 1/0102* (2013.01); *G02F 1/0121* (2013.01); *G02F 1/292* (2013.01); *H01L 33/06* (2013.01); *H01L 33/44* (2013.01); *H01Q 3/08* (2013.01); *H01Q 3/44* (2013.01); *B60K 31/0008* (2013.01); *B60K 2031/0025* (2013.01); *B82Y 20/00* (2013.01); *G02F 2202/30* (2013.01); *G02F 2203/24* (2013.01)

(58) Field of Classification Search
CPC ... G02F 1/01; G02F 1/167; G02F 1/19; E06B 9/24; E06B 2009/2464
USPC ......................................................... 359/238
See application file for complete search history.

(56) References Cited

U.S. PATENT DOCUMENTS

| | | |
|---|---|---|
| 6,464,363 B1 | 10/2002 | Nishioka et al. |
| 9,547,186 B2 | 1/2017 | Han et al. |

(Continued)

FOREIGN PATENT DOCUMENTS

EP    3324235 A1    5/2018

OTHER PUBLICATIONS

Communication dated Dec. 19, 2018, from the European Patent Office in counterpart European Application No. 17205947.9.

(Continued)

*Primary Examiner* — Mohammed A Hasan
(74) *Attorney, Agent, or Firm* — Sughrue Mion, PLLC (57) ABSTRACT

Disclosed is a beam steering device capable of adjusting a reflection angle of incident light and reflecting the incident light to a desired location. Also disclosed is an optical apparatus configured to detect light reflected from an external object and to extract information with respect to the external object. The beam steering device includes: a substrate; an antenna layer disposed on the substrate; a dielectric layer covering the antenna layer; a refractive index changing layer disposed on the dielectric layer; and an electrode layer disposed on the refractive index changing layer.

23 Claims, 7 Drawing Sheets

(51) Int. Cl.
    *G02B 5/00*     (2006.01)
    *H01L 33/06*     (2010.01)
    *G02B 1/00*     (2006.01)
    *G02F 1/29*     (2006.01)
    *G01S 7/481*     (2006.01)
    *B82Y 20/00*     (2011.01)
    *B60K 31/00*     (2006.01)

(56) References Cited

U.S. PATENT DOCUMENTS

| | | | |
|---|---|---|---|
| 2003/0160722 A1 | 8/2003 | Kwon et al. | |
| 2016/0327648 A1 | 11/2016 | Lipson et al. | |
| 2017/0031183 A1* | 2/2017 | Han | G02F 1/0102 |
| 2017/0168373 A1 | 6/2017 | Kim et al. | |
| 2017/0248830 A1* | 8/2017 | Kim | G02F 1/295 |
| 2019/0107711 A1* | 4/2019 | Blanche | G02B 26/0808 |

OTHER PUBLICATIONS

Communication dated Jul. 30, 2018, from the European Patent Office in counterpart European Application No. 17205947.9.

* cited by examiner

BEAM STEERING DEVICE AND OPTICAL APPARATUS INCLUDING THE SAME

CROSS-REFERENCE TO RELATED APPLICATION

This application claims priority from Korean Patent Application No. 10-2017-0078042, filed on Jun. 20, 2017, in the Korean Intellectual Property Office, the disclosure of which is incorporated herein in its entirety by reference.

BACKGROUND

1. Field

Apparatuses and methods consistent with exemplary embodiments relate to a beam steering device and an optical apparatus including the same, and more particularly, to a beam steering device capable of adjusting a reflection angle of incident light and reflecting the incident light toward a desired location, and an optical apparatus configured to sense light reflected from an external object and extract information with respect to the external object.

2. Description of the Related Art

Recently, advanced driving assistance systems (ADASs) having various functions have been commercialized. For example, vehicles having functions such as adaptive cruise control (ACC) or autonomous emergency braking (AEB), have increased. ACC is characterized in that a location and a speed of other vehicles are recognized; when there is a risk of collision, the speed of a vehicle is decreased, and when there is no risk of collision, the vehicle is driven within a pre-set speed range. AEB is characterized in that when a front vehicle is recognized and there is a risk of collision, but a driver does not react to this situation or reacts in an inappropriate way, autonomous braking is performed to prevent the collision. Also, it is expected that vehicles capable of autonomous driving will be commercialized in the near future.

Accordingly, interest in optical measuring apparatuses for providing information regarding a vehicle's surroundings has increased. For example, a vehicle light detection and ranging (LiDAR) apparatus may provide information with respect to a distance between a vehicle and an object near the vehicle, a relative speed, an azimuth, etc. by emitting a laser beam toward a selected area around the vehicle and detecting a reflected laser beam. To this end, the vehicle LiDAR apparatus includes a beam steering device for emitting light toward a desired area.

SUMMARY

Additional exemplary aspects and advantages will be set forth in part in the description which follows and, in part, will be apparent from the description, or may be learned by practice of the presented exemplary embodiments.

According to an aspect of an exemplary embodiment, a beam steering device includes: a substrate; an antenna layer disposed on the substrate; a dielectric layer covering the antenna layer; a refractive index changing layer disposed on the dielectric layer; and an electrode layer disposed on the refractive index changing layer.

The refractive index changing layer may include a material having a refractive index which is variable according to application of an electrical signal.

The refractive index changing layer may include an electro-optic material.

The refractive index changing layer may include a transparent conductive oxide.

The antenna layer may be configured to reflect incident light via localized surface plasmon resonance, and a reflection angle of light reflected by the antenna layer may change according to a change in the refractive index of the refractive index changing layer.

The substrate may be transparent with respect to the incident light to be steered by the beam steering device.

The substrate and the antenna layer may be disposed such that the incident light passes through the substrate and reaches the antenna layer and light reflected by the antenna layer passes through the substrate.

A plurality of antenna layers, a plurality of dielectric layers, a plurality of refractive index changing layers, and a plurality of electrode layers may be disposed on the substrate so as to form a two-dimensional matrix array.

The beam steering device may further include an electrode pad electrically connected to the electrode layer and providing an electrical signal to the electrode layer.

The electrode pad may be disposed at an edge of the substrate.

According to an aspect of another exemplary embodiment, a beam steering device package includes: a beam steering device; and a package frame within which the beam steering device is mounted, wherein the beam steering device includes: a substrate; an antenna layer disposed on the substrate; a dielectric layer covering the antenna layer; a refractive index changing layer disposed on the dielectric layer; and an electrode layer disposed on the refractive index changing layer.

The package frame may include a mounting groove which is recessed, and within which the beam steering device is to be mounted, and an opening may be formed in a central portion of the mounting groove such that light passes through the opening.

The substrate and the package frame may be disposed such that the incident light passes through the opening and the substrate and reaches the antenna layer, and light reflected from the antenna layer passes through the substrate and the opening.

The substrate may have a light-incident surface that opposite to a surface on which the antenna layer is disposed, and the beam steering device package may further include a lens disposed on the light-incident surface of the substrate and concentrating the incident light on the antenna layer.

The beam steering device may further include a heat radiation member disposed in the mounting groove together with the beam steering device and radiating heat generated from the beam steering device to the outside.

The beam steering device may further include: an electrode pad disposed on the substrate, electrically connected to the electrode layer, and configured to provide an electrical signal to the electrode layer; an external electrode disposed on an external surface of the package frame; and a bonding wire electrically connecting the external electrode and the electrode pad.

According to an aspect of another exemplary embodiment, an optical apparatus includes: a light source; a beam steering device configured to reflect light emitted from the light source in a desired direction; and a light detector configured to detect the light emitted from the light source and reflected from an external object, wherein the beam steering device includes: a substrate; an antenna layer disposed on the substrate; a dielectric layer covering the antenna layer; a refractive index changing layer disposed on the dielectric layer; and an electrode layer disposed on the refractive index changing layer.

The optical apparatus may be a distance sensor or a three-dimensional sensor.

The substrate may be transparent with respect to the light emitted from the light source, and the substrate and the antenna layer may be disposed such that the light emitted from the light source passes through the substrate and reaches the antenna layer, and light reflected from the antenna layer passes through the substrate.

The optical apparatus may further include a computer configured to calculate information with respect to the external object, based on a measurement result of the light detector.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Hereinafter, a beam steering device and an optical apparatus including the same will be described in detail with reference to the accompanying drawings. In the drawings, like reference numerals refer to like elements throughout, and sizes of components may be exaggerated for clarity and convenience of explanation. Also, embodiments described hereinafter are only exemplary and various modifications of the embodiments are possible. In addition, with respect to a layered structure described below, the expression "above" or "on" may denote not only direct contact from above/below/right/left, but also indirectly above/below/right/left without contact.

Figure 1:
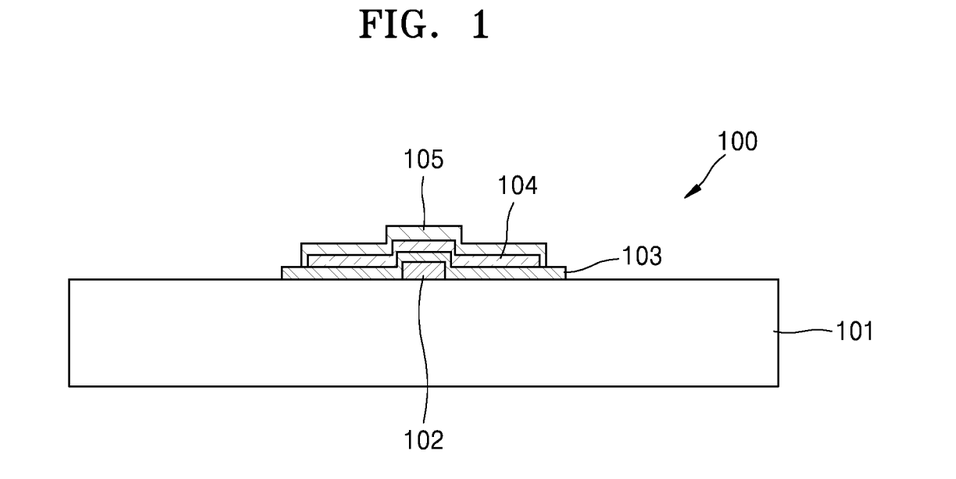
FIG. 1 is a schematic cross-sectional view of a structure of a beam steering device according to an exemplary embodiment.

FIG. 1 is a schematic cross-sectional view of a structure of a beam steering device 100 according to an embodiment. Referring to FIG. 1, the beam steering device 100 may include a substrate 101, an antenna layer 102 disposed on the substrate 101, a dielectric layer 103 disposed on the antenna layer 102, a refractive index changing layer 104 disposed on the dielectric layer 103, and an electrode layer 105 disposed on the refractive index changing layer 104. As shown in FIG. 1, the dielectric layer 103 may be disposed on an area of the substrate 101 so as to completely cover the antenna layer 102. As also shown, the refractive index changing layer 104 may not completely cover the dielectric layer 103 and may be disposed only on a portion of the dielectric layer 103, the portion corresponding to the antenna layer 102. FIG. 1 illustrates that the electrode layer 105 is also disposed on a portion of the dielectric layer 103 so as to completely cover the refractive index changing layer 104. However, the electrode layer 105 may be disposed only on the refractive index changing layer 104.

The antenna layer 102, which performs a function of an antenna for light, may capture and emit energy by causing localized surface plasmon resonance with respect to light having a particular wavelength. Surface plasmon resonance is a phenomenon by which an electric field is highly increased in a localized metal surface, as free electrons in a metal collectively resonate when light is incident onto the metal. Typically, surface plasmon resonance occurs at an interface between a metal and a non-metal. To this end, the antenna layer 102 may include a metal material, such as Au, Ag, Cu, or Al.

The dielectric layer 103 may electrically insulate the antenna layer 102 from the refractive index changing layer 104 and the electrode layer 105, and protect the antenna layer 102. The dielectric layer 103 may include, for example, $SiO_2$, or may include a material having a high dielectric constant, such as $Al_2O_3$, $HfO_2$, etc.

The refractive index changing layer 104 may have a refractive index that changes according to a magnitude of a voltage applied to the electrode layer 105. To this end, the refractive index changing layer 104 may include a material having a refractive index which changes according to application of an electrical signal. For example, the refractive index changing layer 104 may include a material having an electro-optic property. The material having an electro-optic property may include, for example, a crystalline material, such as potassium tantalate niobate (KTN), $LiNbO_3$, lead zirconate titanate (PZT), etc., or may include any of various polymers having an electro-optic property. Also, the refractive index changing layer 104 may include a transparent conductive oxide (TCO). The TCO may include indium tin oxide (ITO), or a ZnO-based oxide, such as indium zinc oxide (IZO), aluminum zinc oxide (AZO), gallium zinc oxide (GZO), etc. The TCO may have a refractive index that changes according to an application of an electrical signal.

The plasmon resonance characteristic of the antenna layer 102 may depend on the dielectric constant of a non-metal material around the antenna layer 102. Thus, when the refractive index of the refractive index changing layer 104 changes, the plasmon resonance characteristic of the antenna layer 102 may also change. For example, when the refractive index of the refractive index changing layer 104 changes, a resonance wavelength, a resonance wavelength width, a polarized light property, a resonance angle, a reflection/absorption/transmittance property of plasmon resonance, etc. may change. By utilizing this phenomenon, an angle at which light, incident onto the antenna layer 102, is reflected may be adjusted by changing the refractive index of the refractive index changing layer 104. Accordingly, the beam steering device 100 may steer light incident thereon, at a desired angle, by adjusting the voltage applied to the electrode layer 105.

Figure 2:
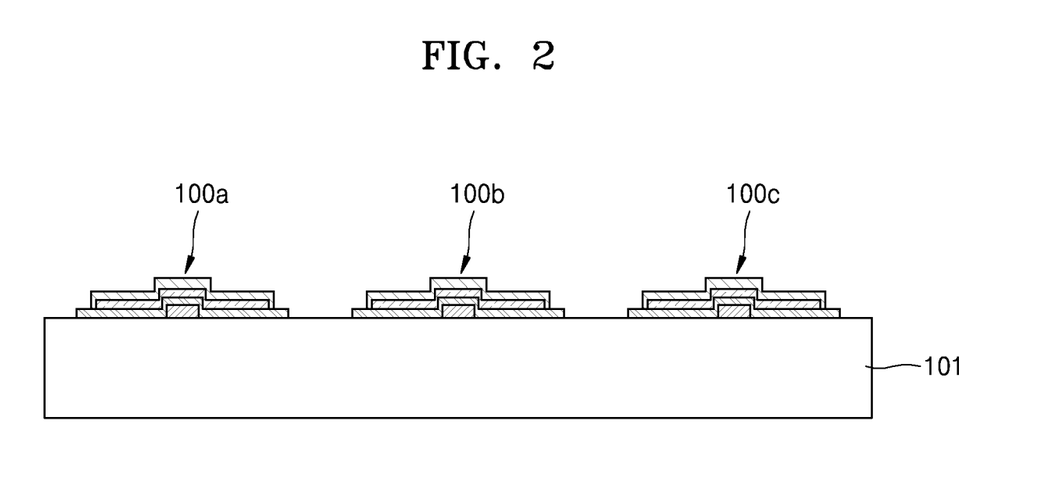
FIG. 2 is a schematic cross-sectional view of a structure of a beam steering device array according to an exemplary embodiment.

For convenience, FIG. 1 illustrates that one beam steering device 100 is disposed on the substrate 101. However, a plurality of beam steering devices 100 may be formed on the substrate 101. For example, FIG. 2 is a schematic cross-sectional view of a structure of a beam steering device array according to an exemplary embodiment. Referring to FIG. 2, the beam steering device array may include a plurality of beam steering devices 100a, 100b, and 100c formed on the substrate 101. FIG. 2 illustrates three beam steering devices 100a, 100b, and 100c, for convenience. However, exemplary embodiments are not limited thereto. For example, a plurality of beam steering devices 100 may be disposed to form a two-dimensional matrix array. In this case, the beam steering device array may adjust a reflection angle of a laser beam having a large beam diameter or a high power. Also, as illustrated in FIG. 2, a plurality of antenna layers 102, a plurality of dielectric layers 103, a plurality of refractive index changing layers 104, and a plurality of electrode layers 105 may be disposed on the substrate 101 so as to form a two-dimensional matrix array, wherein the plurality of antenna layers 102 are separated from one another, the plurality of dielectric layers 103 are separated from one another, the plurality of refractive index changing layers 104 are separated from one another, and the plurality of electrode layers 105 are separated from one another. However, alternately, the may be an arrangement in which a plurality of antenna layers 102 are separated from one another and are two-dimensionally arranged on the substrate 101, but one single dielectric layer 103, one single refractive index changing layer 104, and one single electrode layer 105 are be formed so as to cover the plurality of antenna layers 102.

Figure 3A:
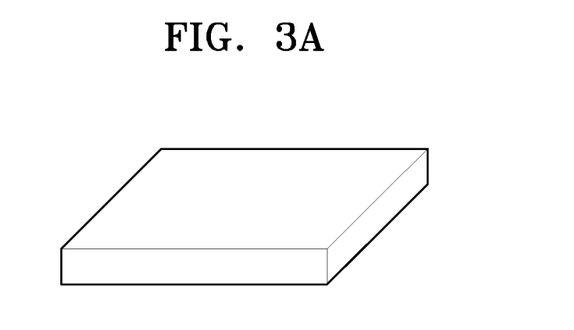
FIGS. 3A through 3C are perspective views of examples of various pattern structures of an antenna layer of a beam steering device according to an exemplary embodiment.
Figure 3B:
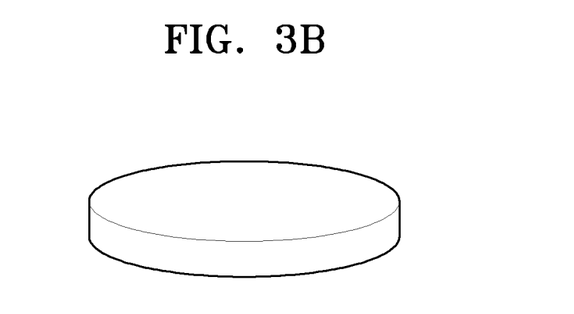
Figure 3C:
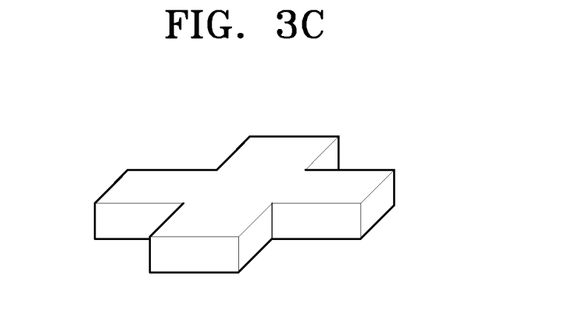

The plasmon resonance characteristics of the antenna layer 102 may depend on the structure shapes of each of the plurality of antenna layers 102 or on the specific arrangement of the plurality of antenna layers 102. For example, FIGS. 3A through 3C are perspective views of examples of various structure shapes of the antenna layer 102 of the beam steering device 100, according to exemplary embodiments. As illustrated in FIGS. 3A through 3C, the antenna layer 102 may have a rectangular shape (FIG. 3A), a circular disk shape (FIG. 3B), or a cross shape (3C). Also, according to desired function, the antenna layer 102 may be formed to have any of various other structure shapes, such as a hemisphere, a semi-circle, a triangle, an oval, or a polygon such as a pentagon, etc. Based on these structure shapes of the antenna layer 102, a resonance wavelength, a resonance wavelength width, a polarized light property, a resonance angle, a reflection/absorption/transmittance property of plasmon resonance, etc. may be determined. Thus, the structure shape of the antenna layer 102 may be selected by taking into account factors, such as a wavelength of a laser beam, a polarized light property, or an output power, adjusted by the beam steering device 100, a range of beam steering angles or a driving voltage of the beam steering device 100, a refractive index changing range of the refractive index changing layer 104, or the like.

FIGS. 4A through 4E are cross-sectional views for describing an exemplary method of manufacturing the beam steering device 100 illustrated in FIG. 1.

Figure 4A:
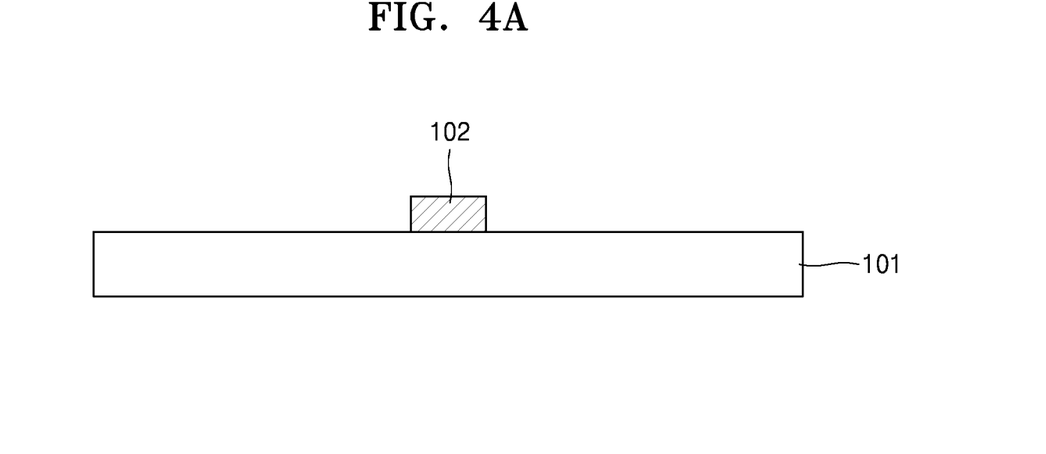
FIGS. 4A through 4E are cross-sectional views for describing an exemplary method of manufacturing the beam steering device illustrated in FIG. 1.

First, referring to FIG. 4A, the antenna layer 102 may be formed on the substrate 101. Here, the substrate 101 may include a material which is transparent with respect to incident light that is to be steered by the beam steering device 100. For example, the substrate 101 may include $SiO_2$, glass, sapphire, or a transparent polymer, and when the incident light is infrared light, the substrate 101 may include a material which is transparent with respect to infrared rays. To form the antenna layer 102, a material of the antenna layer 102 may be deposited on an entire surface of the substrate 101, and then, the material of the antenna layer 102 may be patterned via etching. For example, each of the plurality of antenna layers 102 may be patterned so as to have the shapes illustrated in FIGS. 3A through 3C. Also, as illustrated in FIG. 2, the plurality of antenna layers 102 may be patterned so as to be formed on the substrate 101.

Figure 4B:
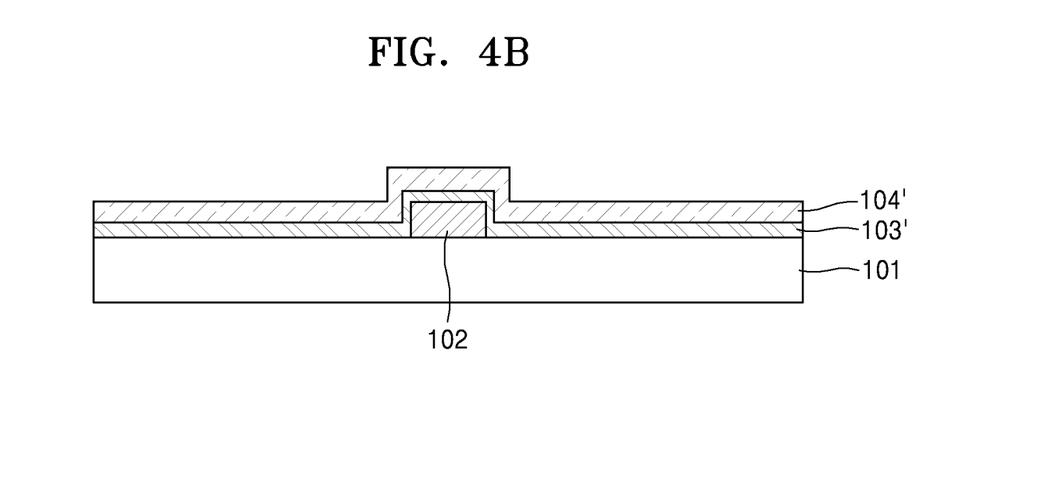

Next, referring to FIG. 4B, a dielectric layer material 103' may be disposed over the entire surface of the substrate 101, such that it covers the antenna layer 102. Then, a refractive index changing layer material 104' may be disposed over an entire surface of the dielectric layer material 103'. For example, $SiO_2$, $Al_2O_3$, or $HfO_2$ may be disposed over the entire surface of the substrate 101, as the dielectric layer material 103', and then, KTN, $LiNbO_3$, PZT, ITO, IZO, AZO, or GZO may be disposed over the dielectric layer material 103', as the refractive index changing layer material 104'.

Figure 4C:
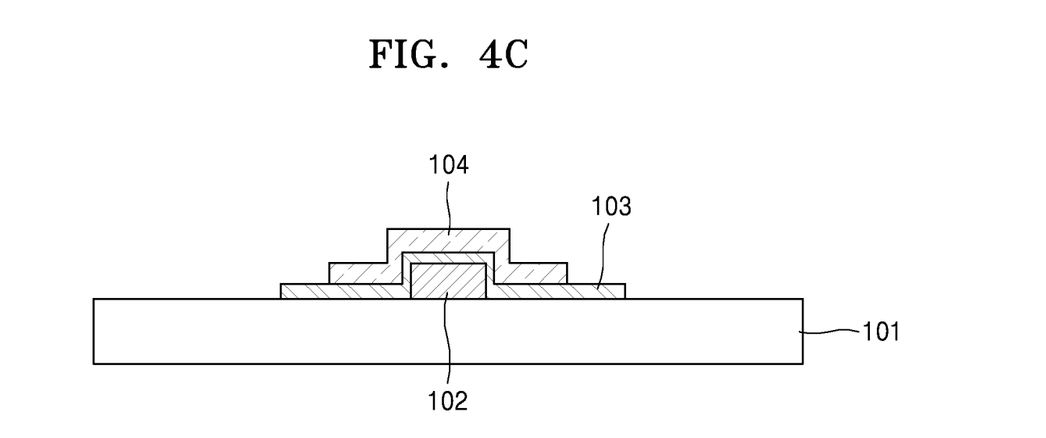

Thereafter, referring to FIG. 4C, the refractive index changing layer material 104' may be patterned via etching to form the refractive index changing layer 104. Next, the dielectric layer material 103' may be patterned via etching to form the dielectric layer 103. Here, some of the dielectric layer material 103' is not removed and is left on a portion of the substrate 101 surrounding the antenna layer 102, such that the dielectric layer 103 completely covers the antenna layer 102. In this way, the antenna layer 102 is not exposed to the outside.

Figure 4D:
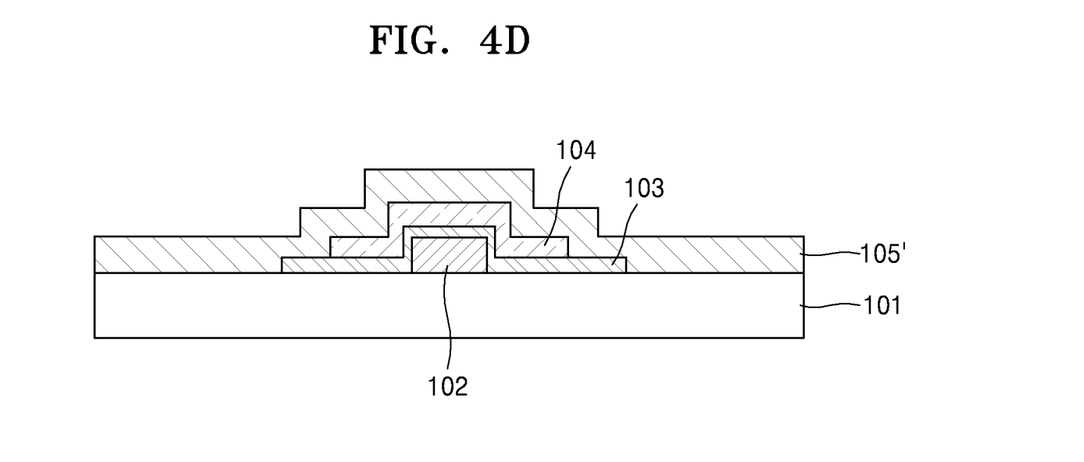

Thereafter, referring to FIG. 4D, an electrode layer material 105' may be disposed over the entire surfaces of the substrate 101, the dielectric layer 103, and the refractive index changing layer 104, which have already been formed. The electrode layer material 105' may be disposed, for example, by sputtering a conductive metal.

Figure 4E:
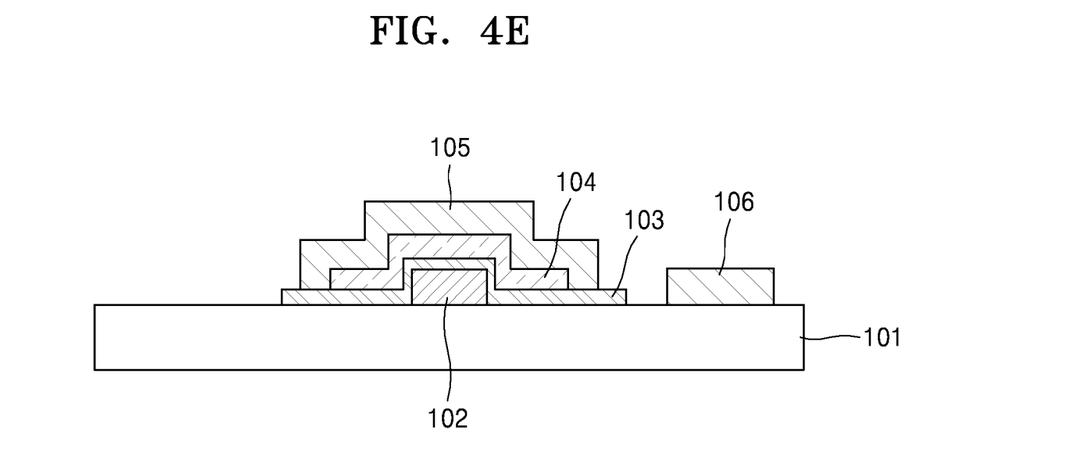

Lastly, referring to FIG. 4E, the electrode layer material 105' may be patterned to form the electrode layer 105 on the refractive index changing layer 104. Here, some of the electrode layer material 105' may not be removed and may be left on a portion of the dielectric layer 103 surrounding the refractive index changing layer 104, such that the electrode layer 105 may completely cover the refractive index changing layer 104. Also, when the electrode layer material 105' is patterned, an electrode pad 106 may be formed at the same time. The electrode pad 106 may be disposed at an edge of the substrate 101, and may be electrically connected, via wire bonding, to an external electrode 211 (refer to FIG. 5) that is to be described later. The electrode pad 106 may be electrically connected to the electrode layer 105 and may provide an external electrical signal to the electrode layer 105. Although it looks that the electrode pad 106 and the electrode layer 105 are disconnected from each other in FIG. 4E, the electrode pad 106 and the electrode layer 105 may be electrically connected to each other via wires (not shown) therebetween. For example, the electrode layer 105, the electrode pad 106, and the wires may each include the electrode layer material 105', and may be simultaneously formed by patterning the electrode layer material 105'. FIGS. 4A through 4E show an exemplary method of manufacturing one beam steering device 100. However, an array of the plurality of beam steering devices 100a, 100b, and 100c illustrated in FIG. 2 may be manufactured by using the same process.

Figure 5:
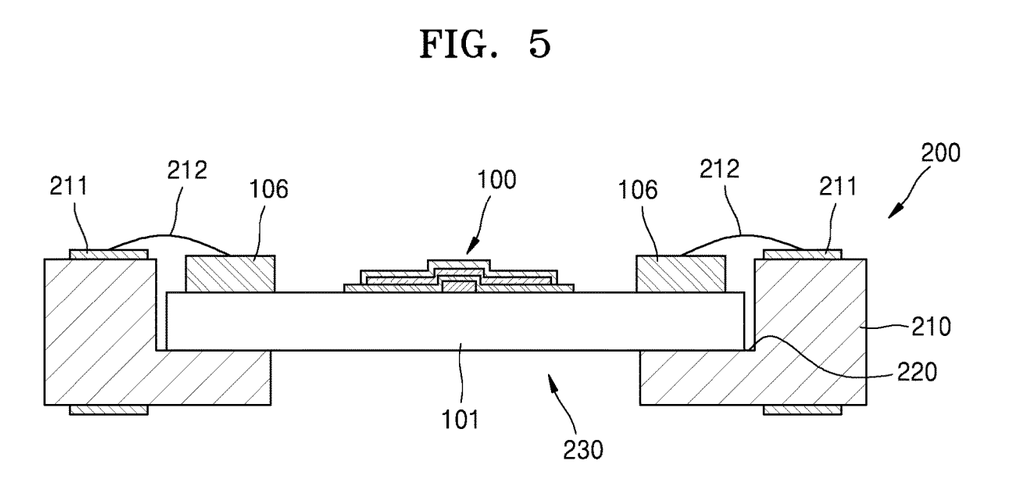
FIG. 5 is a schematic cross-sectional view of a structure of a beam steering device package according to an exemplary embodiment.

The beam steering device 100 manufactured by using the process described above may be packaged. For example, FIG. 5 is a schematic cross-sectional view of a structure of a beam steering device package 200 according to an exemplary embodiment. Referring to FIG. 5, the beam steering device package 200 according to an exemplary embodiment may include a package frame 210 in which the beam steering device 100 is mounted. The package frame 210 may include a mounting groove 220 which is recessed, and in the center of which the beam steering device 100 is to be mounted. A depth of the mounting groove 220, or a distance between an upper surface of an external wall of the package frame 210 surrounding the mounting groove 220 and a bottom surface of the mounting groove 220 may be greater than a total height of the beam steering device 100. In this case, the beam steering device 100 mounted in the mounting groove 220 does not protrude to the outside the package frame 210.

The beam steering device 100 may be disposed such that the substrate 101 contacts the bottom surface of the mounting groove 220. In other words, the beam steering device 100 may be disposed such that a first surface of the substrate 101, on which the antenna layer 102, the dielectric layer 103, the refractive index changing layer 104, the electrode layer 105, and the electrode pad 106 are formed, is disposed toward the outside of the mounting groove 220, and a second surface of the substrate 101, which is at an opposite side to the first surface of the substrate 101, contacts the bottom surface of the mounting groove 220. In addition, an opening 230 may further be formed in a central portion of the mounting groove 220 such that light may pass through the center of the mounting groove 220. Thus, the second surface of the substrate 101 of the beam steering device 100 may be exposed to the outside via the opening 230. A width or a diameter of the opening 230 may be less than a width or a diameter of the mounting groove 220. In this case, edge portions of the second surface of the substrate 101 may contact the bottom surface of the mounting groove 220, and a central portion of the second surface of the substrate 101 may be exposed to the outside via the opening 230. Also, the beam steering device 100 may be disposed such that the antenna layer 102 disposed on the first surface of the substrate 101 is located near the central portion of the opening 230. In this case, since the antenna layer 102 is formed directly on the first surface of the substrate 101 and the substrate 101 is transparent, the antenna layer 102 may be seen from the outside through the opening 230 and the substrate 101.

Also, the beam steering device package 200 may further include the external electrode 211 disposed on an external surface of the package frame 210 and a bonding wire 212 electrically connecting the electrode pad 106 formed on the substrate 101 of the beam steering device 100 with the external electrode 211. For example, the external electrode 211 may be formed on an upper surface of an external wall of the package frame 210. The external electrode 211 may be connected to, for example, a control device, etc., and an electrical control signal received from the control device may be transmitted to the electrode layer 105 of the beam steering device 100 via the external electrode 211, the bonding wire 212, and the electrode pad 106.

Figure 6:
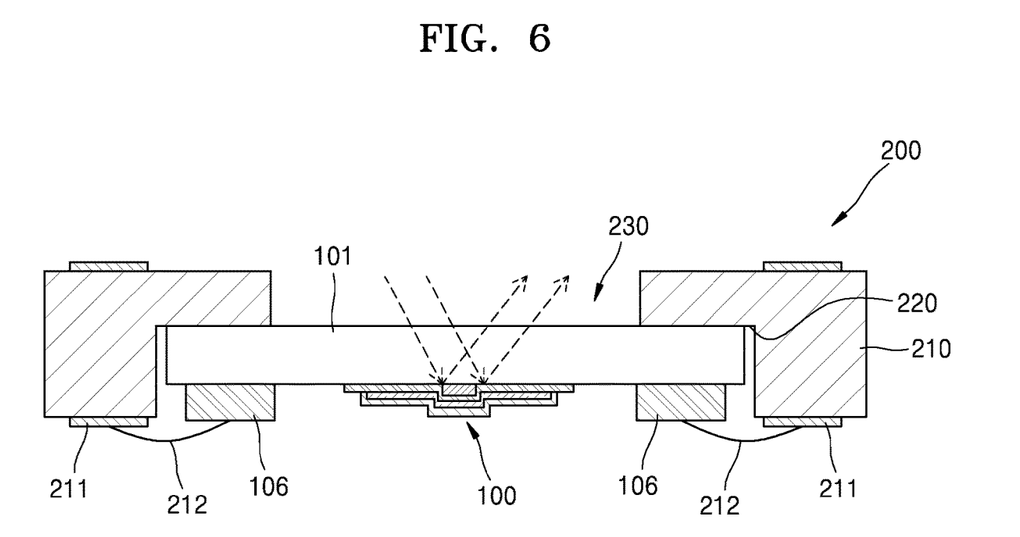
FIG. 6 is a cross-sectional view of an arrangement of the beam steering device package illustrated in FIG. 5 when in use.

The beam steering device package 200 may be used by being turned upside down such that the second surface of the substrate 101 of the beam steering device 100 is facing a direction from which a laser beam is incident. For example, FIG. 6 is a cross-sectional view of an arrangement for use of the beam steering device package 200 illustrated in FIG. 5. As illustrated in FIG. 6, when the beam steering device package 200 of FIG. 5 is used by being turned upside down, a laser beam emitted from the outside passes through the opening 230 and is transmitted through the substrate 101 and then is incident onto the antenna layer 102. Thus, the second surface of the substrate 101 of the beam steering device 100 may become a light-incident surface. Thereafter, the laser beam is reflected from the antenna layer 102 and is emitted by being transmitted through the substrate 101 and passing through the opening 230. Here, an angle at which the laser beam is reflected may be adjusted based on an electrical signal applied to the electrode layer 105.

As described above, in the beam steering device 100 according to the present exemplary embodiment, the antenna layer 102 is formed on the substrate 101 which is transparent, and thus, the beam steering device 100 may be disposed for use such that only the substrate 101 is exposed to the outside. Thus, since the beam steering device 100, in particular, the antenna layer 102, is not directly exposed to the outside, no additional component for protecting the beam steering device 100 is required. As a result, the structure of the beam steering device 100 may be simplified, and a manufacturing process of the beam steering device 100 may be less complex.

Figure 7:
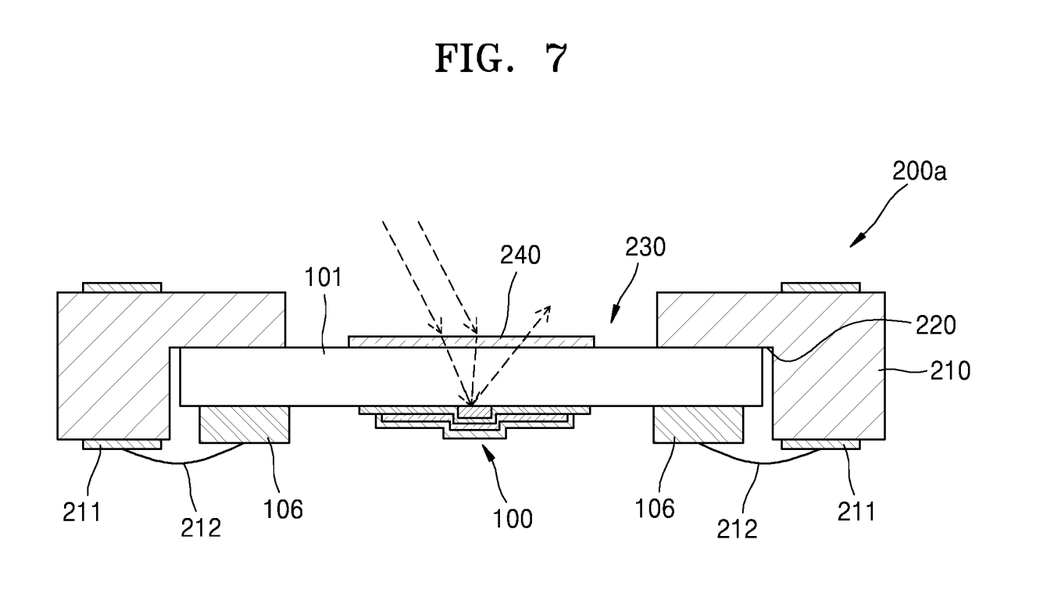
FIG. 7 is a schematic cross-sectional view of a structure of a beam steering device package according to another exemplary embodiment.

FIG. 7 is a schematic cross-sectional view of a structure of a beam steering device package 200a according to another exemplary embodiment. Referring to FIG. 7, the beam steering device package 200a may additionally include a lens 240 disposed on the second surface of the substrate 101 of the beam steering device 100, the second surface being the light-incident surface on which light is incident. The lens 240 may concentrate the incident light onto the antenna layer 102. For example, a focal distance of the lens 240 may be equal to a distance between the lens 240 and the antenna layer 102 or equal to a thickness of the substrate 101. By using the lens 240, the beam steering device 100 may have improved optical utilization efficiency.

Figure 8:
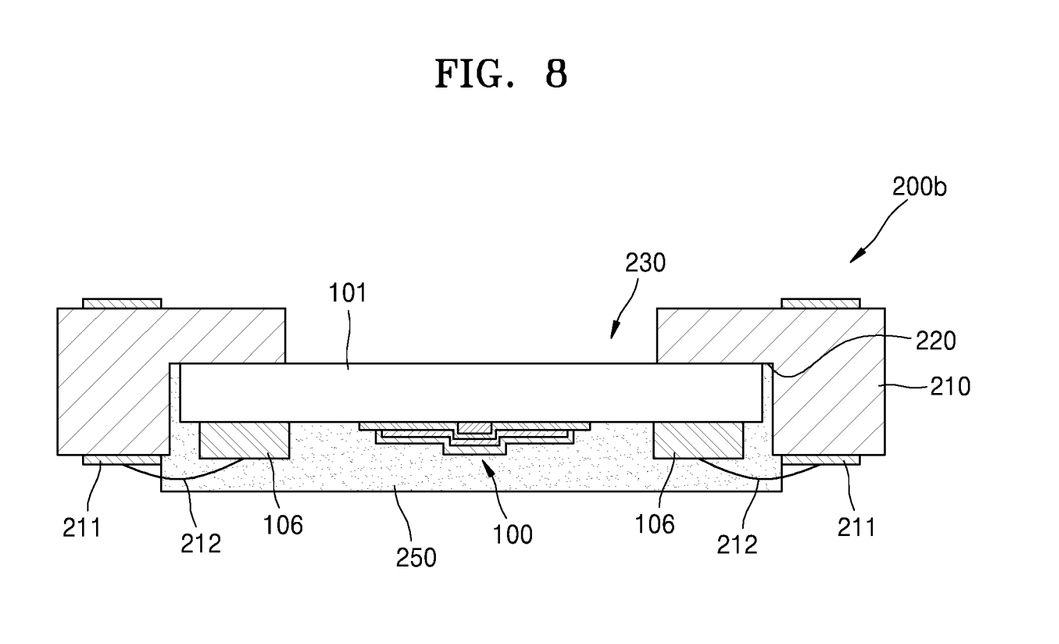
FIG. 8 is a schematic cross-sectional view of a structure of a beam steering device package according to another exemplary embodiment.

Also, FIG. 8 is a schematic cross-sectional view of a structure of a beam steering device package 200b according to another exemplary embodiment. Referring to FIG. 8, the beam steering device package 200b may include a heat radiation member 250 for radiating heat, generated by the beam steering device 100, to the outside. The heat radiation member 250 may be disposed in the mounting groove 220 of the package frame 210, along with the beam steering device 100. For example, the heat radiation member 250 may fill the mounting groove 220 so as to cover the beam steering device 100. Thus, since the heat radiation member 250 may be disposed to directly contact the beam steering device 100, the heat radiating effect thereof may be improved.

As described above, by using the beam steering device package 200 illustrated in FIGS. 5 and 6, the lens 240 for concentrating light on the antenna layer 102 may be easily disposed, and thus, optical loss may be reduced and the optical utilization efficiency may be improved. Also, since the heat radiation member 250, which is non-transparent, may be disposed to directly contact the beam steering device 100, heat generated by the beam steering device 100 may be easily radiated to the outside.

Figure 9:
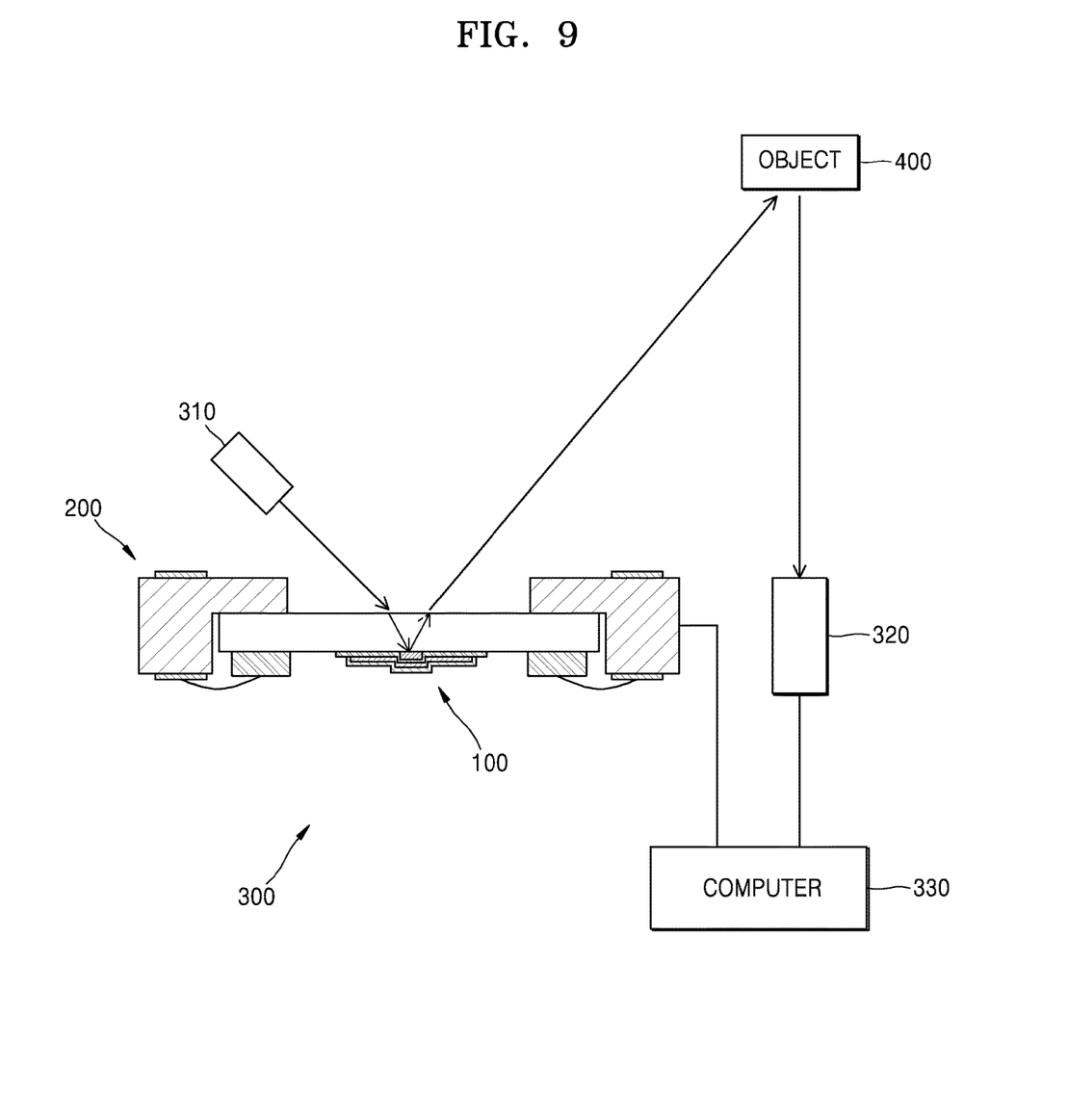
FIG. 9 is a schematic cross-sectional view of a structure of an optical apparatus according to an exemplary embodiment.

The beam steering device 100 and the beam steering device package 200 described above may be utilized in any of various optical apparatuses configured to actively control a direction in which light is irradiated. For example, FIG. 9 is a schematic cross-sectional view of a structure of an optical apparatus 300 according to an exemplary embodiment. Referring to FIG. 9, the optical apparatus 300 may include a light source 310 providing light, the beam steering device package 200, an optical detector 320 detecting light emitted from the light source 310 and reflected from an external object 400, and a computer 330 calculating information with respect to the external object 400 based on a measuring result of the optical detector 320. Also, the computer 330 may control operations of the light source 310, the beam steering device package 200, and the optical detector 320. For example, the beam steering device package 200 may reflect the light emitted from the light source 310 in a specific direction under control of the computer 330.

The optical apparatus 300 may be a three-dimensional sensor, such as a vehicle LiDAR apparatus, or a distance sensor used for a three-dimensional camera. When the optical apparatus 300 is a vehicle LiDAR apparatus, the computer 330 may calculate information with respect to a distance between a vehicle and an object at a front end or a rear end of the vehicle, a relative speed, a location of an azimuth, etc. Also, when the optical apparatus 300 is a distance sensor of a three-dimensional camera, the computer 330 may calculate information with respect to distances from a vehicle to various objects in a field of the camera. To this end, the optical apparatus 300 may periodically scan light with respect to a front end thereof or irradiate light toward a specific area of the front end thereof, by using the beam steering device package 200.

While the beam steering device and the optical apparatus including the same have been described with reference to the exemplary embodiments illustrated in the drawings, it will be understood by those of ordinary skill in the art that these are only examples, and various changes in form and details may be made therein without departing from the spirit and scope as defined by the following claims. Therefore, exemplary embodiments described herein should be considered in a descriptive sense only and not for purposes of limitation.

What is claimed is:

1. A beam steering device comprising:
   a substrate;
   an antenna layer disposed on the substrate;
   a dielectric layer disposed on the antenna layer and covering the antenna layer;
   a refractive index changing layer disposed on the dielectric layer; and
   an electrode layer disposed on the refractive index changing layer.

2. The beam steering device of claim 1, wherein the refractive index changing layer comprises a material having a refractive index which is variable according to application of an electrical signal.

3. The beam steering device of claim 2, wherein the refractive index changing layer comprises an electro-optic material.

4. The beam steering device of claim 2, wherein the refractive index changing layer comprises a transparent conductive oxide.

5. The beam steering device of claim 1, wherein the antenna layer is configured to reflect incident light via localized surface plasmon resonance, and a reflection angle of light reflected by the antenna layer is variable according to a refractive index of the refractive index changing layer.

6. The beam steering device of claim 5, wherein the substrate is transparent with respect to the incident light to be steered by the beam steering device.

7. The beam steering device of claim 6, wherein the substrate and the antenna layer are disposed such that light incident on the substrate is transmitted through the substrate and is incident on the antenna layer, and light reflected by the antenna layer is transmitted through the substrate.

8. The beam steering device of claim 1, wherein a two-dimensional matrix array, comprising a plurality of antenna layers, a plurality of dielectric layers, a plurality of refractive index changing layers, and a plurality of electrode layers is disposed on the substrate.

9. The beam steering device of claim 1, further comprising an electrode pad electrically connected to the electrode layer, wherein the electrode pad is configured to provide an electrical signal to the electrode layer.

10. The beam steering device of claim 9, wherein the electrode pad is disposed at an edge of the substrate.

11. A beam steering device package comprising:
    a beam steering device; and
    a package frame within which the beam steering device is mounted,
    wherein the beam steering device comprises:
      a substrate;
      an antenna layer disposed on the substrate;
      a dielectric layer disposed on the antenna layer and covering the antenna layer;
      a refractive index changing layer disposed on the dielectric layer; and
      an electrode layer disposed on the refractive index changing layer.

12. The beam steering device package of claim 11, wherein the package frame comprises:
    a recessed mounting groove, wherein the beam steering device is mounted within the mounting groove, and
    an opening formed in a central portion of the mounting groove such that light passes through the opening.

13. The beam steering device package of claim 12, wherein the substrate is transparent with respect to incident light to be steered by beam steering device.

14. The beam steering device package of claim 13, wherein the substrate and the package frame are disposed such that light incident on the beam steering device package is transmitted through the opening and the substrate, and is incident on the antenna layer, and light reflected from the antenna layer is transmitted through the substrate and the opening.

15. The beam steering device package of claim 14, wherein the substrate has a light-incident surface that is opposite a surface of the substrate on which the antenna layer is disposed, and
    wherein the beam steering device package further comprises a lens disposed on the light-incident surface of the substrate, wherein the lens concentrates light incident thereon onto the antenna layer.

16. The beam steering device package of claim 12, further comprising a heat radiation member disposed within the mounting groove, wherein the radiation member radiates heat generated from the beam steering device to the outside.

17. The beam steering device package of claim 11, wherein the refractive index changing layer comprises a material having a refractive index which is variable according to application of an electrical signal.

18. The beam steering device package of claim 11, wherein the antenna layer is configured to reflect incident light via localized surface plasmon resonance, and a reflection angle of the incident light reflected by the antenna layer is variable according to a refractive index of the refractive index changing layer.

19. The beam steering device package of claim 11, further comprising:

an electrode pad disposed on the substrate and electrically connected to the electrode layer, wherein the electrode pad is configured to provide an electrical signal to the electrode layer;

an external electrode disposed on an external surface of the package frame; and a bonding wire electrically connecting the external electrode and the electrode pad.

20. An optical apparatus comprising:

a light source;

a beam steering device configured to reflect light emitted from the light source in a desired direction; and a light detector configured to detect the light emitted from the light source and reflected from an external object, wherein the beam steering device comprises:

a substrate;

an antenna layer disposed on the substrate;

a dielectric layer disposed on the antenna layer and covering the antenna layer;

a refractive index changing layer disposed on the dielectric layer; and     an electrode layer disposed on the refractive index changing layer.

21. The optical apparatus of claim 20, wherein the optical apparatus is one of a distance sensor and a three-dimensional sensor.

22. The optical apparatus of claim 20, wherein the substrate is transparent with respect to the light emitted from the light source, and     the substrate and the antenna layer are disposed such that light emitted from the light source is transmitted through the substrate and is incident on the antenna layer, and light reflected from the antenna layer is transmitted through the substrate.

23. The optical apparatus of claim 20, further comprising a processor configured to calculate information with respect to the external object, based on a measurement result of the light detector.

\* \* \* \* \*